United States Patent [19]
Kim et al.

[11] Patent Number: 5,899,745
[45] Date of Patent: May 4, 1999

[54] METHOD OF CHEMICAL MECHANICAL POLISHING (CMP) USING AN UNDERPAD WITH DIFFERENT COMPRESSION REGIONS AND POLISHING PAD THEREFOR

[75] Inventors: Sung C. Kim, Pflugerville; Lei Ping Lai, Austin; Rajeev Bajaj, Austin; Adam Manzonie, Austin, all of Tex.

[73] Assignee: Motorola, Inc., Schaumburg, Ill.

[21] Appl. No.: 08/887,695

[22] Filed: Jul. 3, 1997

[51] Int. Cl.$^6$ .................................................. H01L 21/00
[52] U.S. Cl. .............................. 438/692; 216/38; 216/88; 156/345
[58] Field of Search .................................... 438/690, 691, 438/692, 693; 156/345 LP; 216/38, 88, 89

[56] References Cited

U.S. PATENT DOCUMENTS 5,435,772  7/1995  Yu .............................................. 451/41

*Primary Examiner*—William Powell
*Attorney, Agent, or Firm*—J. Gustav Larson; Keith E. Witek

[57] ABSTRACT

A chemical mechanical polishing (CMP) method utilizes a polishing pad (21) and an under pad (20). The under pad (20) has an edge portion (24) and a central portion (22). The central portion (22) has either a shore D hardness less than a shore D hardness of the portion (24), greater slurry absorption than the edge portion (24), or more compressibility than the edge portion (24). This composite material under pad (20) will improve polishing uniformity of a semiconductor wafer (39). In addition, the use of the polishing pads (20 and 21) allows for greater final wafer profile control than was previously available in the art (FIGS. 4–6).

29 Claims, 3 Drawing Sheets

5,899,745

METHOD OF CHEMICAL MECHANICAL POLISHING (CMP) USING AN UNDERPAD WITH DIFFERENT COMPRESSION REGIONS AND POLISHING PAD THEREFOR

FIELD OF THE INVENTION

The present invention relates generally to semiconductor manufacturing, and more particularly to, chemical mechanical polishing (CMP) of a semiconductor wafer using an under pad having different compressibility regions and a top pad.

BACKGROUND OF THE INVENTION

In the integrated circuit (IC) industry, chemical mechanical polishing (CMP) is being used to polish both metallic and dielectric layers. In order to chemically mechanically polish (CMP) a wafer, a platen/table is provided where a polishing pad is placed on top, of the platen. A chemical slurry is then dispensed on the polishing pad and the polishing pad is rotated. While the polishing pad is spinning, a semiconductor wafer, which is attached to a wafer carrier, is brought in contact with the slurry-covered wafer pad. A chemical and mechanical interaction between the slurry, the polishing pad, and a top surface of the wafer results in material being removed from a top surface of the wafer whereby a planar top surface topography of the wafer is achieved after a certain polishing time period.

A problem confronted by chemical mechanical process engineers is the fact that the polish rate of the center of the semiconductor wafer is much slower or different from the polish rate at the edge of the wafer. These different polishing rates, which are due to lack of uniform slurry transport, rotational speed variations across the radial surface of the wafer, etc., result in the polished surface of the wafer being substantially non-uniform. This non-uniformity CMP problem is clearly illustrated in prior art FIG. 1. FIG. 1 illustrates a semiconductor wafer 10. A top surface of the semiconductor wafer 10 has been polished in FIG. 1. FIG. 1 illustrates a central portion 12 of the wafer 10 and an edge portion 14 of the wafer 10. As can be clearly seen from FIG. 1, the central portion 12 of the wafer 10 has been polished at a much slower rate than the edge portion of the wafer 14 resulting in a thicker central portion of the wafer 10. The difference in wafer-scale material thickness after completion of chemical mechanical polish processing results in reduced yield due to either over-polishing at the edge 14 or under-polishing at the center 12.

The integrated circuit (IC) industry has tried many different methods in an attempt to reduce the non-uniform polishing surface illustrated in FIG. 1. A first method has attempted to make polishing pads that have varying pore densities across a surface of the pad. In one form, a pore density at the edge of the polishing pad is increased when compared to a pore density of the pad near the center of the wafer. This difference in pore density results in the edge of the wafer being exposed to less pad polishing surface while the center of the wafer is exposed to more polishing surface. This difference in polishing surface from the edge 14 to the center 12 may, under certain circumstances, improve chemical mechanical polishing uniformity. However, the changing of the pore density throughout a pad has some disadvantageous effects. First, the changing of the pore density of a chemical mechanical polishing pad does not reduce slurry transport problems associated with CMP non-uniformity. In fact, more pores at the edge may exacerbate this transport problem causing even further non-uniformity than before under certain processing conditions. Therefore, the uniformity improvement resulting from the use of changing pore densities of pads is self-limiting and not overly controllable.

In a second method, the integrated circuit industry has attempted to provide geometric shapes on the surface of a polishing pad to improve slurry transport. For example, geometric grooves have been formed within a top surface of the polishing pad to allow for improved uniformity of slurry transport which aids in polishing uniformity. However, it has been shown that use of grooves on polishing pad surfaces does not eliminate the non-uniformity of the polished surface and is difficult to control in a repeatable manner over pad lifetime.

In addition, the integrated circuit industry has attempted to use overhang polishing in order to render a center polish rate of a wafer and an edge polish rate of a wafer more uniform. Overhang polishing is a process whereby an edge of the wafer is moved off of the edge of a polishing pad so that a portion of the wafer is on the polishing pad while an edge portion of the wafer is not in contact with the polishing pad. In other words, an edge portion of the wafer is periodically not exposed to any polishing surface. By reducing the polish surface area exposed to the edge, the theory is that the edge polish rate will be reduced. Overhang polishing is limited since the overhang of the wafer with respect to the polishing pad can only be slight in order to avoid wafer breakage and serious wafer damage. Therefore, the uniform correcting nature of overhang polishing is inherently limited and typically results in small uniformity improvements that do not entirely eliminate the non-uniformity problem.

The integrated circuit (IC) industry has attempted to apply a backside air pressure to the center of a wafer in order to mechanically bow a wafer such that a polishing rate of a center portion of a wafer is increased with respect to the edge of the wafer. However, the backside air pressure, which is applied to the backside of a wafer, cannot exceed the mechanical pressure applied to the wafer by the wafer carrier. This inherent limitation of the use of backside air is necessary since if backside air pressure increases above the mechanical down pressure of the wafer, the wafer will no longer stay in proper position on the polishing equipment. Therefore, there is inherent limitations in backside air pressure which does not allow the industry to obtain adequate wafer polishing uniformity when backside air pressure is the only uniformity-correcting mechanism used.

Therefore, a need exists for a polishing method and/or a polishing system which will improve the center to edge uniformity of a polished semiconductor wafer and enhance the degree of controllability of the edge-to-center polish rates.

Figure 1:
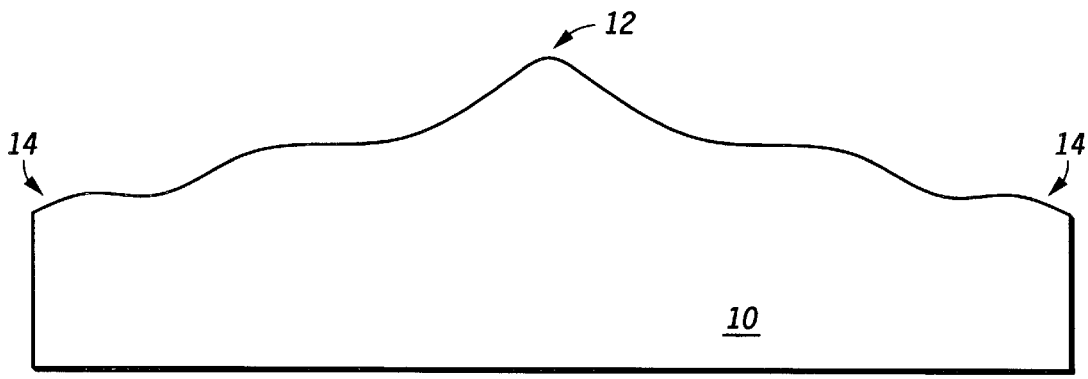
FIG. 1 illustrates, in a cross-sectional diagram, a semiconductor wafer which is polished in a non-uniform manner using one of the prior art polishing methods.

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

DESCRIPTION OF A PREFERRED EMBODIMENT

Generally, the present invention is an improved method for chemically mechanically polishing (CMP) a top surface of a semiconductor wafer. The improved chemical mechanical polishing process utilizes an under pad which has two distinct regions having different material properties. An edge or outer-radial region of the under pad is made of a material which is one or more of either: (1) a harder material than the center under pad portion; (2) less compressible than the center portion of the under pad; and/or (3) less slurry-absorbent (i.e., less porous) than the center portion of the center portion of the slurry pad. Accordingly, a center portion of the under pad is made of a material which is at least one of either: (1) more compressible and/or less hard than the edge portion of the under pad; (2) more absorptive of slurry than the edge portion of the under pad; and/or (3) less hard than the edge portion of the under pad. This isolated under pad which comprises a radial region and a center region having either different hardness, different slurry absorption rates, and/or different compressibilities, has been shown to improve wafer polishing uniformity of a top surface of a semiconductor wafer without need for further polishing modifications.

However, wafer center-to-edge polishing uniformity can be even more improved and/or controlled by providing a specific polishing pad above the under pad discussed herein. In addition to providing the new under pad as, a polishing pad overlying the under pad can be used wherein this polishing pad has openings, or holes, formed therethrough. These openings, in conjunction with the different materials within the under pad, further improve chemical mechanical polishing slurry transport whereby polishing uniformity is improved. In other words, the openings near a center of the wafer which underly a more compressible portion of the under pad will have a greater slurry absorption, flow, or velocity, than the edge portions which overly a less compressible edge portion of the under pad. This vertical slurry flow differential across the surface of the pad improves uniformity. In summary, the different absorption of the under pad's edge and under pad's center alters a slurry transport profile whereby wafer polishing uniformity is even further improved over a system which simply uses the under pad in isolation.

Furthermore, the different hardness and/or compressibility of the underlying under pad allows the overlying polishing pad to flex in critical polishing areas. This flexing allows for energy to be transported selectively to select portions of the wafer whereby polishing uniformity is improved.

The invention can be further understood with reference to FIGS. 2–7.

Figure 2:
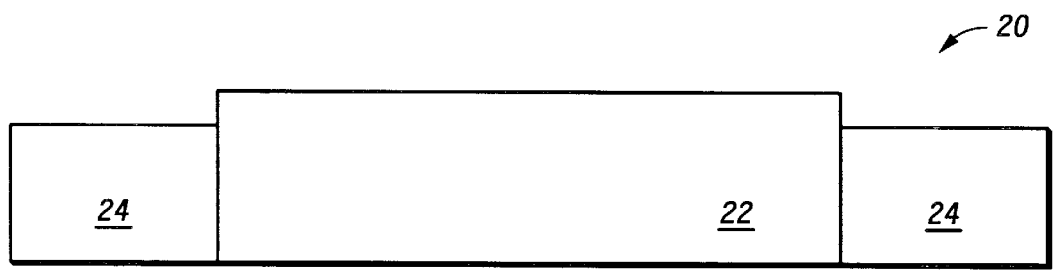
FIG. 2 illustrates, in a cross-sectional diagram, an improved under pad which is used in a polishing system to obtain greater polishing uniformity in accordance with the present invention.

FIG. 2 illustrates an under pad 20 which is used in a chemical mechanical polishing (CMP) system. The under pad 20 will underlie or support a polishing pad which will typically overlie the under pad 20 of FIG. 2. Under pad 20 has a central portion 22 and an edge portion 24. The central portion 22 of the under pad 20 is typically formed having a thickness X. The edge portion 24 of the under pad 20 is typically formed to a thickness Y, wherein Y is less than X. It is important to note that the pad portions 22 and 24 in alternate embodiments could be formed having a substantially equal thickness (X≈Y), or the pad portions 22 and 24 in alternate embodiments could be formed wherein X≦Y. However, a preferred embodiment is an embodiment wherein the distance X is greater than the distance Y as illustrated in FIG. 2.

The central portion 22 of under pad 20 may be formed from a soft synthetic felt material. Specifically, the pad portion 22 of under pad 20 is made of polyurethane fibers formed into a large polish surface (20–30 inch diameter circular pad for rotational polishers and a 12–20 inch wide belt for a linear polisher). Therefore, portion 22 of under pad 10 may be made using Suba IV material which is available in the IC industry by RODEL, Inc. Generally, the portion 22 of FIG. 2 may be any material which has a vertical compressibility which is greater than a vertical compressibility of the edge pad region 24. In another form, the region 22 is a material which has a greater slurry absorption than the region 24 of FIG. 2. In yet another form, the shore D hardness of the region 22 should be less than a shore D hardness of the layer 24. It is this gradient or step-function shift in one or more of slurry absorption, compressibility, and/or shore D hardness in the under pad 20 that has resulted in improved wafer polishing uniformity and greater control of the final-polished wafer surface profile. The greater controllability aspect accomplished through wafer oscillation control and is discussed in detail in FIGS. 4–6. It is important to note that the industry has typically taught that these parameters of under pad absorption (porosity), under pad compressibility, etc., have little to do with uniformity. The greater uniformity and improved uniformity control taught herein was more than expected.

The region 24 of FIG. 2 is typically made of a plastic material which is similar to the plastic material used in circuit board manufacturing. Layer 24 of FIG. 2 can be an FR4 material which is available in the industry from RODEL, Inc. In a preferred form, the region 24 is less compressible in a vertical direction than the region 22. Also, the region 24 absorbs CMP slurry at a lesser rate than the region 22 of under pad 20. In addition, it is advantageous that the shore D hardness of the region 24 be greater than a shore D hardness of the region 22 of the pad 20. The inclusion of an under pad 20 along with an overlying polishing pad 21 has shown to improve polishing pad lifetime, improve cross-wafer uniformity, and reduce semiconductor wafer damage. The composite pad illustrated in FIG. 2 has the further advantage of improved center-to-edge polishing uniformity across a wafer (i.e., global wafer uniformity). Furthermore, the use of the under pad of FIG. 2 has been shown to enable far more uniformity control between the edge and the center of a semiconductor wafer than was previously possible in the industry. In fact, the changing of oscillation speed and wafer oscillation distances while using the under pad 20 of FIG. 2 has been shown to result in surface control ranging from center-heavy polishing to edge-heavy polishing and any polishing level therebetween. This selectivity in center-to-edge polishing rate differentials has not been previously obtained in the industry.

Typical hardnesses of region 24 is greater than 40 shore D. Typical hardnesses of region 22 is roughly 5 to 30 shore D, and a typical hardnesses of pad 21 is roughly 25 to 50 shore D.

Figure 3:
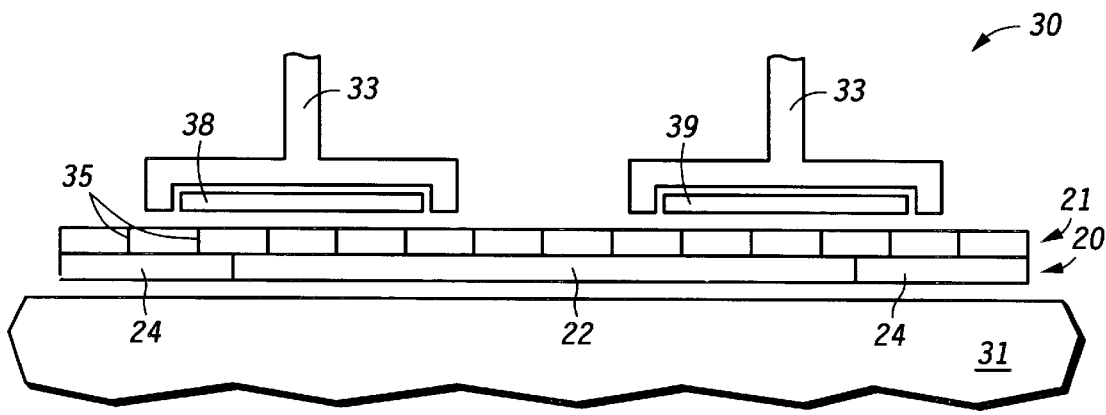
FIG. 3 illustrates, in a cross-sectional diagram, a rotational wafer polishing system which uses the under pad of FIG. 2 to obtain more uniform edge-to-center chemical mechanical polishing of a wafer in accordance with the present invention.

FIG. 3 illustrates a chemical mechanical polish (CMP) system 30. System 30 contains a platen or table 31. The platen or table 31 is used to support one or more polishing pads 20 and 21. Note that the polishing pads 20 and 21 may be two segmented and different polishing pads or the polishing pads 20 and 21 may be a single fused pad whereby pads 20 and 21 form a single inseparable polishing pad. The polishing pad 20 contains a central region 22 and an edge region 24 as previously discussed with respect to FIG. 2. Overlying the under pad 20 is a top polishing pad 21. In a preferred form, the polishing pad 21 has a hardness and/or a compressibility which is between a hardness and/or compressibility of the regions 22 and 24. In other embodiments, the polishing pad 21 can be softer or harder than any of the materials used to form the under pad 20. In a preferred form, the pad 21 may be a commercially available IC1000 or IC1400 polishing pad. The IC1000 and the IC1400 pads are commercially available by RODEL, Inc.

FIG. 3 illustrates that the CMP system 30 has a wafer carrier 33. FIG. 3 specifically illustrates that two wafers can be processed at the same time using a single pad configuration. However, it should be noted that any number of wafers from one wafer (i.e., a single wafer system) to a plurality of wafers (i.e., a batch 5-wafer system) can be implemented using the pad technology taught herein. Since FIG. 3 specifically illustrates a dual wafer CMP system, two wafers 38 and 39 are affixed to carriers 33 and placed in contact with the polishing pad 21. When polishing, the pads 21 and 20 will rotate in a first direction while the wafers 39 and 38 will rotate in a second direction. In one embodiment, the wafer pads 20 and 21 can rotate in a same direction as the wafers 39 and 38. In another embodiment, the polishing pads 20 and 21 can be rotating in a radially-opposite direction from the rotation of the wafers 39 and 38. In addition, the carriers 33 can be controlled to oscillate in a lateral direction across the surface of the polishing pad 21 at a predetermined oscillation speed and over a predetermined oscillation distance. Typically oscillation distances are from roughly 0 inches (no oscillation) to six inches across the surface of the pad. Oscillations of up to 50% of the wafer's diameter are plausible. Typical wafer oscillation speeds include speeds from 1 mm/sec to 10 mm/sec. When utilizing the under pad 20, the entire surface area of both wafers 38 and 39 will always be in contact with the polishing pad 21 and no overhang polishing is needed in the system of FIG. 3 in order to obtain improved uniformity.

To further improve polishing uniformity, the polishing pad 21 can be formed with openings 35 formed therethrough. Due to the different rates of slurry absorption by regions 22 and 24 of the under pad 20, slurry transport through the openings 35 of the polishing pad 21 will be graded across a lateral surface of the polishing pad 21, thereby improving slurry transport to critical areas of the wafer. In other words, slurry will transport more efficiently through the openings 35 of the pad 21 which overlie the region 22 than through openings 35 of the pad 21 which overlie the region 24. This graded slurry transport over the radius of the pad 21 has been shown to even further improve uniformity over and above the use of the improved under pad 20.

In addition, the different compressibilities of the regions 22 and 24 results in a rebound effect from the pad portion 22 whereby this rebound effect improves the uniformity of the polished surface of the semiconductor wafers 39 and 38. It is important to note that somewhere between 0% and 50% of the wafer's diameter is designed to overlie the portion 24 during the chemical mechanical processing and during oscillation. For example, some embodiments may use a wafer oscillation wherein a peak oscillation distance towards the center of the pads 20/21 results in 0% wafer overlap with region 24 wherein a peak oscillation distance towards the edge of the pads 20/21 results in 50% wafer overlap with region 24. As another example, in other embodiments, no oscillation will be needed whereby the wafer is laterally positioned by carrier 33 at a fixed location with 20% overlap with region 24.

Figure 4:
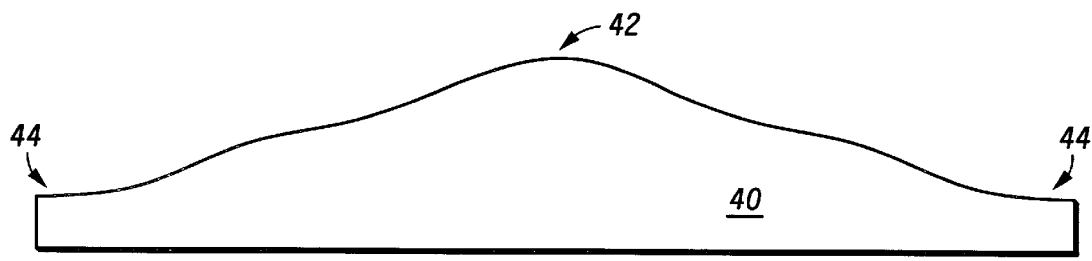
FIGS. 4–6 illustrates, in cross-sectional diagrams, the range of wafer surface profiles which can be controllably obtained when utilizing the polishing under pad of FIG. 2 in accordance with the present invention.
Figure 5:
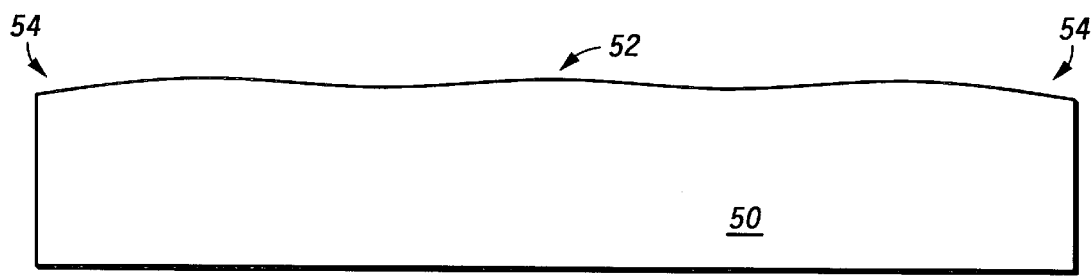
Figure 6:
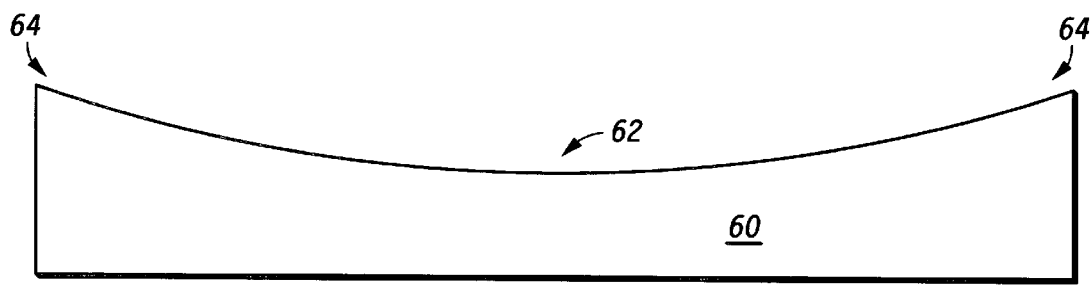

FIGS. 4–6 illustrate the many different wafer surface topographies/profiles which can be obtained by changing the lateral oscillation distance of the carrier 33 of FIG. 3 and/or the lateral oscillation speed of the wafer carrier 33 of FIG. 3. The structures polished in FIGS. 4–6 were shallow trench isolation (STI) structures which are generally known in the art as being one of the most difficult structures to control in terms of polishing uniformity.

FIG. 4 illustrates that the system of FIG. 3 can be utilized to form an edge-heavy polishing process to form a convex surface, whereby the edges 44 of a wafer 40 are polished at a faster rate than a center portion 42 of the wafer 40. The wafer surface profile of FIG. 4 was obtained using the polishing pad illustrated in FIG. 2 in conjunction with an IPEC 472 polishing system which is publicly available in the integrate circuit (IC) industry. The profile of FIG. 4 was obtained by using a down force or polish force on the carrier 33 (see FIG. 3) of roughly 3.0 pounds per square inch (psi). In FIG. 4, the backside air pressure through an internal portion of the carrier 33 to a backside portion of the wafer 39 is roughly zero psi. The polishing pads 20 and 21 were rotated at roughly 50 rotations per minute (RPM). Also, the wafer carrier 33 was rotated at roughly 41 rotations per minute (RPM) in the same clockwise direction as the pads 20/21. The lateral oscillation range/distances of the carrier 33 was between 130 millimeter (mm) and 150 millimeter (mm) on the IPEC 472 (i.e. a 20 mm total oscillation swing). A speed of oscillation is roughly 1 millimeter per second (mm/s). It is also important to note that the profile of FIG. 4 was obtained for a 200 millimeter wafer. Note that the pads 20 and 21 taught herein can be used in a specific oscillation set-up to obtain a highly edge-heavy polishing process.

FIG. 5 illustrates that the polishing system of FIG. 3 can be used to obtain a substantially flat polished topography for a semiconductor wafer 50. FIG. 5 illustrates a wafer 50 having a central portion 52 and an edge portion 54. The polishing in FIG. 5 was performed on a 200 millimeter wafer 50 using an IPEC 472 polishing system. A down force of roughly 3.0 psi was utilized. A backside air pressure of zero psi was also utilized. A platen/table rotational speed of the polishing pads 20 and 21 was roughly 50 RPM. A carrier rotational speed was roughly 41 RPM. However, the oscillation range in FIG. 5 was changed from the range previously discussed in FIG. 4. It was this change that causes the severe and unexpected change in topography between FIGS. 4 and 5. For the device of FIG. 5, the 1 millimeter per second oscillation speed was still maintained as in FIG. 4, but the oscillation range of FIG. 5 was changed to oscillate from 130 millimeters (mm) to 158 millimeters (mm) on the IPEC 472. Therefore, an oscillation distance of 28 millimeters was obtained for FIG. 5 as opposed to the distance of 20 mm for FIG. 4. This apparently small change is significant, since, as can be easily seen from comparing FIG. 5 to FIG. 4, the topography of a polished wafer can be greatly affected by relatively small changes in oscillation distances when using the system of FIG. 3. Therefore, changes in oscillation of the wafer 39 across the surface of the polishing pad 20 and 21 in FIG. 3 results in significant differences in the final surface profile of the polished semiconductor wafer. This type of profile control has not been obtained previously in the IC industry which such small and controllable changes in processing.

FIG. 6 illustrates that the same system FIG. 3 can be slightly changed in oscillation and/or backside air parameters to result in a center heavy polish to provide a concave surface, wherein a center 62 of a wafer 60 polishes at a rate much faster than an edge 64 of the wafer 60. Once again, a 200 millimeter wafer was utilized and the polishing was performed on a IPEC 472 polishing system. A down force of roughly 3.0 psi was utilized with a backside air pressure of approximately 1.0 psi. It is important to note that only the backside air pressure was changed from FIG. 5, and yet results in FIG. 6 show that this apparently small change in backside air pressure obtained significant changes in the final profile of the top surface of the semiconductor wafer 60. The platen RPM from FIG. 6 was maintained at approximately 50 RPM with the carrier rotation 33 of FIG. 3 being maintained at roughly 41 RPM. The oscillation utilized in FIG. 6 was identical to the oscillation utilized in FIG. 5 wherein an oscillation of 130 millimeters to 158 millimeters was used. The speed of oscillation was also maintained at a 1 millimeter per second oscillation speed in FIG. 6. It is clear that small wafer oscillation changes as well as small backside pressure changes can be collectively used alone or with a synergistic affect to drastically change the polishing surface profile/topography of the semiconductor wafer.

Therefore, FIGS. 4–6 clearly illustrate that the under pad of FIG. 2 used in conjunction with the polishing system of FIG. 3 may enable one to accurately control a final profile of a top surface of a semiconductor wafer with relatively minor and simple processing adjustments. This control is obtained by changing either an oscillation speed, a backside air pressure, and/or an oscillation distance of the polishing system illustrated in FIG. 3. This change in oscillation speed and/or oscillation distance can result in an edge-heavy polish, a center-heavy polish, or a substantially uniform polishing rate as is required for any particular processing scenario. These process variations can be implemented dynamically from wafer lot to wafer lot in order to customize desired profiles, or to compensate for pad or equipment variations over time.

Figure 7:
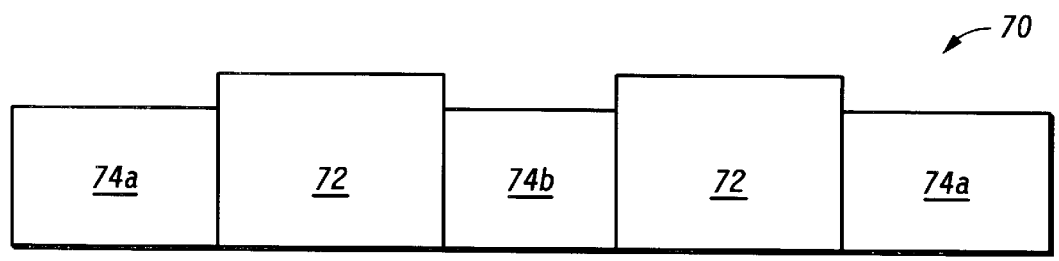
FIG. 7 illustrates, in a cross-sectional diagram, a composite-material under pad used in a polishing system whereby the under pad obtains improved wafer surface uniformity in accordance with the present invention.

FIG. 7 illustrates a composite under pad 70. In FIG. 7, regions 74a and 74b are analogous to the region 24 of FIG. 2. The region 72 of FIG. 7 is analogous to the region 22 of FIG. 2. Therefore, a hardness of a region 74a and 74b is typically greater than a hardness of the region 72; or the slurry absorption of the regions 74a and 74b is less than the slurry absorption of the regions 72; or the compressibility of the layer 72 is greater than the compressibility of the regions 74a and 74b of FIG. 7. Therefore, FIG. 7 clearly illustrates that highly compressive and substantially non-compressive materials can be alternated radially throughout an under pad structure to enable improved CMP wafer surface uniformity.

Figure 8:
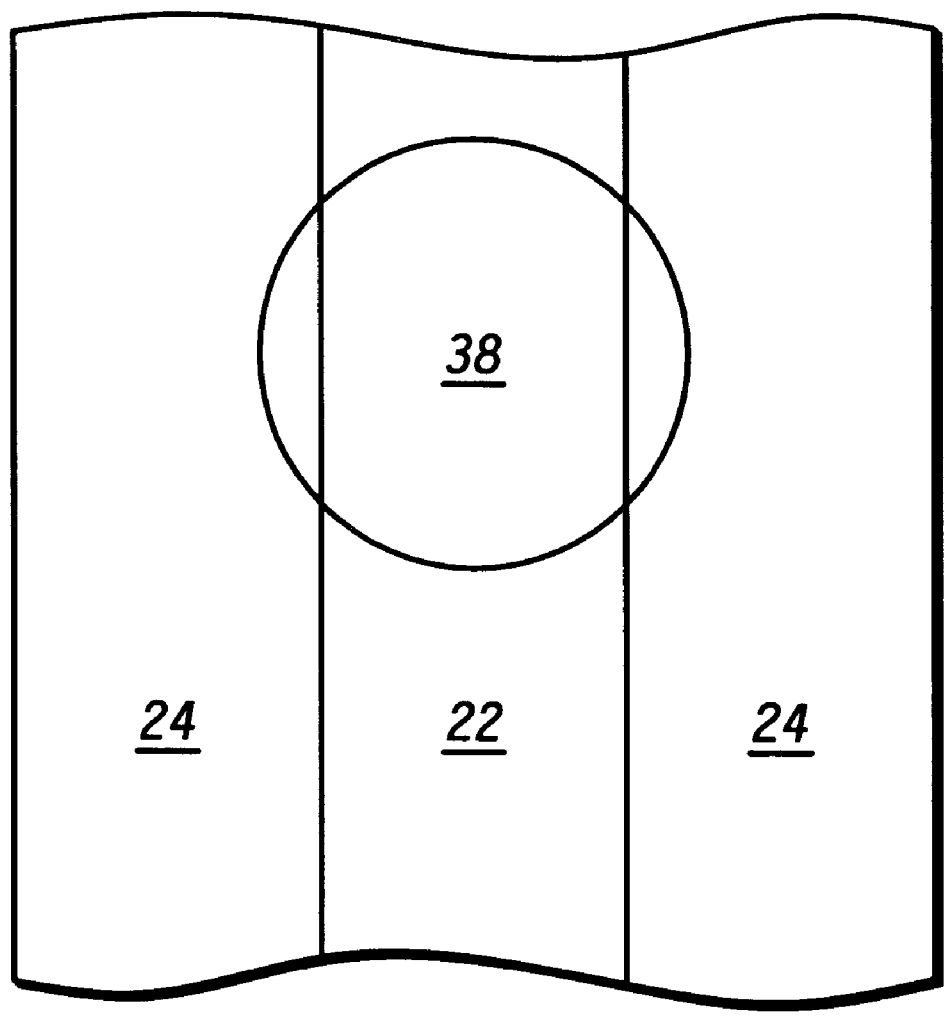
FIG. 8 illustrates, in a cross-sectional diagram, a linear wafer polishing system which uses the under pad of FIG. 2 to obtain more uniform edge-to-center chemical mechanical polishing of a wafer in accordance with the present invention.

FIGS. 2–7 were discussed in conjunction with a rotational polishing system. However, linear polishing systems which utilize a belt for polishing instead of utilizing a circular polishing pad have been proposed for use in the integrated circuit (IC) industry. FIG. 8 illustrates that a belt can comprise a peripheral portion 24 and a central portion 20 which are analogous to the edge portion 24 and central portion 22 of a circular polishing pad illustrated in FIGS. 2 and 3. The composite belt of FIG. 8 can be utilized to polish semiconductor wafers 38 and 39 in accordance with the present invention while obtaining similar uniformity results.

Although the invention has been described and illustrated with reference to specific embodiments, it is not intended that the invention be limited to those illustrative embodiments. Those skilled in the art will recognize that modifications and variations may be made without departing from the spirit and scope of the invention. Therefore, it is intended that this invention encompass all of the variations and modifications as fall within the scope of the appended claims.

What is claimed is:

1. A method for polishing a semiconductor wafer, the method comprising the steps of:

provoding a polishing system, the polishing system having a table wherein a polishing pad and an under pad are located adjacent a surface of the table, the under pad supporting the polishing pad relative to the table, wherein the under pad has a first portion and a second portion, the first portion having first compressibility and includes a center portion of the under pad, and the second portion having a second compressibility where the first compressibility is greater than the second compressibility and the second portion includes a peripheral portion of the under pad;

bringing the semiconductor wafer into contact with the polishing pad; and polishing material from a surface of the semiconductor wafer using the polishing pad.

2. The method of claim 1, wherein the step of bringing the semiconductor wafer into contact comprises:

bringing the semiconductor wafer into contact with the polishing pad over a portion of the first portion.

3. The method of claim 1, wherein the step of providing a polishing system comprises:

providing the polishing pad with a third compressibility, where the third compressibility is greater than the second compressibility.

4. The method of claim 1, wherein the step of providing a polishing system comprises:

providing the polishing pad with a third compressibility, where the third compressibility is less than the first compressibility.

5. The method of claim 4, wherein the step of providing a polishing system comprises:

providing the polishing pad with the third compressibility, the third compressibility being greater than the second compressibility.

6. The method of claim 1, wherein the step of providing a polishing system comprises:

making the first portion substantially non-compressible.

7. The method of claim 1, wherein the step of polishing material comprises:

providing a carrier for holding the semiconductor wafer; and oscillating the carrier between a first position and a second position while polishing the semiconductor wafer, where a difference between the first position and the second position is less than approximately 50% of a diameter of the semiconductor wafer.

8. The method of claim 7, wherein the step of polishing material comprises:

adjusting the difference based upon a time length of polishing pad usage.

9. The method of claim 1, wherein the step of providing a polishing system comprises:

providing the polishing pad, wherein the polishing pad has openings in a top surface of the polishing pad.

10. The method of claim 9, wherein the step of providing a polishing system comprises:

forming the openings in the top surface of the polishing pad so that the openings extend from a top surface of the polishing pad to a bottom surface of the polishing pad.

11. The method of claim 9, wherein the step of polishing comprises:

providing a slurry wherein the slurry flows at a first rate through a hole located over the second portion of the under pad, and the slurry flows at a second rate through an opening located over the first portion of the under pad.

12. The method of claim 1, wherein the step of providing a polishing system comprises:

providing the table as a portion of a linear polishing system.

13. The method of claim 1, wherein the step of providing a polishing system comprises:

providing the table as a portion of a rotational polishing system.

14. The method of claim 1, wherein the step of providing a polishing system comprises:

providing the first portion with a first hardness and the second portion with a second hardness, the first hardness being different from the second hardness.

15. The method of claim 1, wherein the step of providing a polishing system comprises:

providing the first portion with a first porosity and the second portion with a second porosity, the first porosity being different from the second porosity.

16. The method of claim 1, wherein the step of providing a polishing system comprises:

providing the first portion as a center portion of a rotational system, and the second portion as a peripheral portion of a rotational system.

17. The method of claim 1, wherein the step of providing a polishing system comprises:

providing the first portion with a first thickness and the second portion with a second thickness, the first thickness being different from the second thickness.

18. The method of claim 1, wherein the step of providing a polishing system comprises:

providing the under pad having a plurality of portions having the first compressibility.

19. A method for polishing a semiconductor wafer, the method comprising the steps of:

providing a polishing system, the polishing system having a table wherein a polishing pad and an under pad are located adjacent a surface of the table, the under pad supporting the polishing pad wherein the under pad has a second portion and a first portion, the first portion having a first porosity, and the second portion having a second porosity where the first porosity is different than the second porosity;

bringing the semiconductor wafer into contact with the polishing pad; and polishing material from a surface of the semiconductor wafer using the polishing pad.

20. The method of claim 19, wherein the step of providing a polishing system comprises:

providing the first portion with a first hardness and the second portion having a second hardness wherein the first hardness is different from the second hardness.

21. The method of claim 19, wherein the step of providing a polishing system comprises:

providing the first portion with a first compressibility and the second portion having a second compressibility wherein the polishing pad has openings formed therethrough.

22. A method for polishing a semiconductor wafer, the method comprising the steps of:

providing a polishing system, the polishing system having a table wherein a polishing pad and an under pad are located adjacent a surface of the table, the under pad supporting the polishing pad wherein the under pad has a second portion and a first portion, the first portion having first hardness, and the second portion having a second hardness where the first hardness different than the second hardness;

bringing the semiconductor wafer into contact with the polishing pad; and polishing material from a surface of the semiconductor wafer using the polishing pad.

23. A method for polishing a semiconductor wafer, the method comprising the steps of:

providing a polishing system, the polishing system having a composite under pad and a polishing pad, the composite under pad having a first region and a second region, wherein the first region has a first value for a characteristic and the second region has a second value for the characteristic which is different from the first value;

bringing the semiconductor wafer into contact with the polishing pad wherein a slurry is in contact with a surface of the semiconductor wafer; and polishing material from the surface of the semiconductor wafer using the polishing pad with the composite under pad functioning to support the polishing pad.

24. The method of claim 23, wherein the characteristic is hardness.

25. The method of claim 23, wherein the characteristic is porosity.

26. A method for polishing a semiconductor wafer, the method comprising the steps of:

providing a polishing system, the polishing system having a composite under pad and a polishing pad, the composite under pad having a first region and a second region;

bringing the semiconductor wafer into close proximity with the polishing pad wherein a slurry is in contact with a surface of the semiconductor wafer; and polishing the surface of the semiconductor wafer at a first rate over the first region, and at a second rate over the second region, wherein the first rate is different than the second rate.

27. An integrated semiconductor polishing pad comprising:

a first pad layer having a first characteristic value, wherein the first pad layer has a first surface for contacting a semiconductor wafer during a polishing process; and a second pad layer having a first portion having a first characteristic value, and a second portion having a second characteristic value, wherein the second pad layer and the first pad layer are integrally coupled to form the integrated semiconductor polishing pad.

28. A method for polishing a semiconductor wafer comprising the steps of:

provoiding a polishing system having a carrier arm for holding the semiconductor wafer and for providing backside air on the semiconductor wafer, and a platen;

placing an under pad on the platen, wherein the under pad has a first portion and a second portion, the first portion having first characteristic value, and the second portion having a second characteristic value;

placing a polishing pad on the under pad;

placing the semiconductor wafer in the carrier arm;

polishing the semiconductor wafer with a first backside air pressure when a concave wafer surface profile is desirable;

polishing the semiconductor wafer with a second backside air pressure when a convex wafer surface profile is desirable; and polishing the semiconductor wafer with a third backside air pressure when a substantially level wafer surface profile is desirable.

29. A method for polishing a semiconductor wafer comprising the steps of:

providing a polishing system having a platen, and a carrier arm for holding the semiconductor wafer, the carrier arm having an oscillating distance;

placing an under pad on the platen, wherein the under pad has a first portion and a second portion, the first portion having first characteristic value, and the second portion having a second characteristic value;

placing a polishing pad on the under pad;

placing the semiconductor wafer in the carrier arm;

polishing the semiconductor wafer with a first oscillating distance value when a convex wafer is desirable; and polishing the semiconductor wafer with a second oscillating distance value when a concave wafer surface is desirable.

* * * * *